United States Patent [19]

Hanyu et al.

[11] Patent Number: 5,561,010
[45] Date of Patent: Oct. 1, 1996

[54] PHASE SHIFT OPTICAL MASK AND METHOD OF CORRECTING DEFECTS IN OPTICAL MASK

[75] Inventors: Isamu Hanyu; Satoru Asai, both of Kawasaki, Japan

[73] Assignee: Fujitsu Limited, Kawasaki, Japan

[21] Appl. No.: 409,942

[22] Filed: Mar. 23, 1995

Related U.S. Application Data

[63] Continuation of Ser. No. 138,220, Oct. 20, 1993, abandoned.

[30] Foreign Application Priority Data

Oct. 21, 1992 [JP] Japan ..................... 4-282693

[51] Int. Cl.⁶ ....................................................... G03F 9/00
[52] U.S. Cl. .............................. 430/5; 430/323; 430/324; 430/325; 216/12; 216/48
[58] Field of Search .............................. 430/5, 323, 324, 430/325; 156/643, 646

[56] References Cited

U.S. PATENT DOCUMENTS 5,246,801  9/1993  Pierrat .......................................... 430/5
5,272,024  12/1993  Lin ................................................ 430/5

FOREIGN PATENT DOCUMENTS 3-196041  8/1991  Japan.

Primary Examiner—S. Rosasco
Attorney, Agent, or Firm—Staas & Halsey

[57] ABSTRACT

A phase shift optical mask is adapted to receive exposure light and is provided with a transparent substrate, a phase shifter shifting a phase of the exposure light with respect to the phase of the exposure light transmitted through the transparent substrate, and a transparent layer interposed between the transparent substrate and the phase shifter. The transparent layer shifts the phase of the exposure light by $90°+180°\cdot n$ and n is an integer.

14 Claims, 18 Drawing Sheets

PHASE SHIFT OPTICAL MASK AND METHOD OF CORRECTING DEFECTS IN OPTICAL MASK

This application is a continuation, of application Ser. No. 08/138,220, filed Oct. 20, 1993, now abandoned.

BACKGROUND OF THE INVENTION

The present invention generally relates to optical masks and methods of correcting defects in optical masks, and more particularly to a phase shift optical mask which is used in a projection exposure apparatus for producing semiconductor devices or the like, and to a method of correcting defects in such an optical mask.

In very large scale integrated circuits (VLSIs), it has become necessary to form patterns on the order of sub microns and half microns in order to realize a high operation speed and a high integration density.

For example, in the case of a dynamic random access memory having a memory capacity of 4 Mbits (hereinafter simply referred to as 4M-DRAM), the design rule is 0.8 μm, and the design rule is 0.5 to 0.6 μm in the case of a 16M-DRAM. The design rule in the case of a 64M-DRAM is about to become 0.3 μm.

In order to realize such fine patterns, it is essential to realize a reduction projection exposure apparatus (so-called stepper) which is suited for mass production and provides a high resolution when using the lithography technique which forms the basis of the pattern forming process.

However, the reduction in the size of the designed fine patterns have progressed at a speed higher than the development of such exposure apparatuses. As a result, the size of the patterns which are now demanded is not obtainable by the nominal or rated resolution of the stepper. For this reason, attempts are being made to improve the resist material, the resist process or the optical mask in order to exceed the limit of the exposure apparatus.

As mentioned above, the improvement of the optical mask may be regarded as a means of improving the limit of the exposure apparatus. More particularly, the improved optical mask is the so-called phase shift optical mask which is locally provided with a phase shifter for inverting the phase of the exposure light. The lithography technique which uses such a phase shift optical mask is often referred to as a phase shift lithography technique.

As in the case of other lithography techniques, the phase shift lithography technique also requires a defect-free optical mask. However, since the conventional technique used to make the phase shift optical mask newly forms the phase shifter on the optical mask, the generation of defects is unavoidable.

Accordingly, in order to use the phase shift lithography technique which is effective for forming fine patterns when producing the VLSI, it is important to realize a phase shift optical mask having a construction which is less likely to generate defects and to realize a method of satisfactorily correcting the generated defects in a simple manner.

Generally, the defects generated in the phase shift optical mask which is employed by the phase shift lithography technique can be categorized into two kinds of defects. According to a first kind of detect, the phase shifter does not exist at a part of the optical mask where the phase shifter should exist or, even if the phase shifter does exist a portion of the phase shifter is missing. On the other hand, according to a second kind of defect, the phase shifter material is deposited at an unwanted part of the optical mask.

Next, a description will be given of an example of a conventional method of correcting a defect in a phase shift optical mask which is employed by the phase shift lithography technique, by referring to FIGS. 1 through 5. FIGS. 1 through 5 show cross sections of an essential part of the phase shift optical mask at essential stages of the correction. For the sake of convenience, it will be assumed that the phase shift optical mask has a light blocking pattern layer 2 made of Cr formed on a quartz substrate 1, and an etching stopper layer 3 which covers the light blocking pattern layer 2. In addition, a phase shifter 4 is formed on the etching stopper layer 3, but a defect is generated in this phase shifter 4. Accordingly, this defect is corrected by the following steps.

In FIG. 1, a defective portion 4A is generated in the phase shifter 4 when the phase shift optical mask is made by forming the phase shifter 4 which is made of $SiO_2$ on the optical mask using the resist process of the lithography technique, evaporation and lift-off.

In FIG. 2, a resist layer 5 having an opening 5A which exposes the phase shifter 4 with the defective portion 4A using the resist process of the lithography technique.

In FIG. 3, the resist layer 5 is used as a mask to remove the defective portion 4A of the phase shifter 4 by etching.

In FIG. 4, evaporation is carried out with the resist layer 5 remaining, so as to form a $SiO_2$ layer.

In FIG. 5, the structure is submerged in a resist removing solution so as to remove the resist layer 5 by lift-off, and the $SiO_2$ layer formed in the previous step is patterned so as to form a new phase shifter 6.

Next, a description will be given of an example of a conventional method of correcting a defect different from the type described above in a phase shift optical mask which is employed by the phase shift lithography technique, by referring to FIGS. 6 through 9. FIGS. 6 through 9 show cross sections of an essential part of the phase shift optical mask at essential stages of the correction. For the sake of convenience, it will be assumed that the phase shift optical mask has a light blocking pattern layer 2 made of Cr formed on a quartz substrate 1, and an etching stopper layer 3 which covers the light blocking pattern layer 2. In addition, a phase shifter 4 is formed on the etching stopper layer 3, but the phase shifter material is deposited at a part of the optical mask where the phase shifter 4 should not exist. Hence, the phase shift material deposited at the unwanted part of the optical mask is removed by the following steps.

In FIG. 6, a residual portion 4B made of the phase shifter material is generated on the phase shift optical mask where no phase shifter should exist when the phase shift optical mask is made by forming the phase shifter 4 which is made of $SiO_2$ on the optical mask using the resist process of the lithography technique, evaporation and lift-off.

In FIG. 7, a resist layer 5 having an opening 5A which exposes the residual portion 4B of the phase shifter 4 using the resist process of the lithography technique.

In FIG. 8, the resist layer 5 is used as a mask to remove the residual portion 4B of the phase shifter 4 by etching.

In FIG. 9, the structure is submerged in a resist removing solution so as to remove the resist layer 5, so that the phase shift optical mask only has the desired phase shifter 4 and not the residual portion 4B.

The defect correction described above in conjunction with FIGS. 1 through 5 can be made in one of two ways, as may be more easily understood by referring to the following the plan views.

FIG. 10 is a plan view showing an essential part of the phase shift optical mask for explaining the defect correction. In FIG. 10, those parts which are the same as those corresponding parts in FIGS. 1 through 5 are designated by the same reference numerals, and a description thereof will be omitted. In FIG. 10, the illustration of the etching stopper layer 3 is omitted so as to simplify the drawing.

In FIG. 10, a pattern 7 for providing a 0° phase shift corresponds to a region where no Cr light blocking pattern layer 2 exists. On the other hand, a phase shifter 8 made of $SiO_2$ provides a 180° phase shift. This phase shifter 8 includes a defective portion 8A. In other words, a portion of the phase shifter 8 is missing at this defective portion 8A.

A first method of correcting this defective portion 8A shown in FIG. 10 is to remove the entire phase shifter 8 which has this defective portion 8A, and to form a new phase shifter which is required. But in this case, the entire phase shifter which is continuous for a relatively large area becomes the subject of the correction and it takes time and troublesome steps to extract from the original mask data the mask data which are required for the correction when making patterning process. Moreover, in order to guarantee the accurate positioning of the new phase shift layer, it requires an exposure apparatus having a high precision in order to carry out the necessary exposure for the correction.

In addition, if the pattern is long as in the case of a wiring pattern or a bit line or a word line of a memory, it not only takes a long time to make the necessary patterning for the correction, but there is a possibility that a new defect will be generated because the correction is carried out for a relatively large area or region.

On the other hand, the defective portion 8A shown in FIG. 10 may be removed by a second method which will be described hereunder with reference to FIGS. 11 and 12. FIGS. 11 and 12 are plan views showing essential stages of the correction. In FIGS. 11 and 12, those parts which are the same as those corresponding parts in FIGS. 1 through 5 and 10 are designated by the same reference numerals, and a description thereof will be omitted. In FIGS. 11 and 12, the illustration of the etching stopper layer 3 is omitted so as to simplify the drawing.

In FIG. 11, a resist layer (not shown) having an opening 9 which exposes the defective portion 8A is formed using the resist process of the lithography technique. Then, this resist layer is used as a mask and a wet etching using buffered hydrofluoric acid ($HF+NH_4F$) as the etchant is carried out to remove a portion of the phase shifter 8 including the defective portion 8A.

Next, in FIG. 12, a $SiO_2$ layer is formed on the entire surface by evaporation with the resist layer formed in the previous step remaining. Then, the entire structure is submerged in a resist removing solution so as to remove the resist layer by lift-off, and the $SiO_2$ layer formed above is patterned to form a new regrown phase shifter portion 8B.

Accordingly, if the second method is used to correct the phase shifter 8 which partially includes the defective portion 8A, the phase shifter 8 and the new regrown phase shifter portion 8B will not be integrated. As a result, a portion which provides a 0° phase shift, that is, a portion which provides a phase shift different from that provided by the phase shifter 8, is formed at a boundary portion between the phase shifter 8 and the new regrown phase shifter portion 8B. Therefore, a correct pattern exposure cannot be made on a wafer at a portion corresponding to the boundary portion.

SUMMARY OF THE INVENTION

Accordingly, it is a general object of the present invention to provide a novel and useful phase shift optical mask and a method of correcting defects in the optical mask, in which the problems described above are eliminated.

Another and more specific object of the present invention is to provide a phase shift optical mask adapted to receive exposure light, comprising a transparent substrate, a phase shifter shifting a phase of the exposure light with respect to the phase of the exposure light transmitted through the transparent substrate, and a transparent layer interposed between the transparent substrate and the phase shifter, where the transparent layer shifts the phase of the exposure light by 90°+180°·n and n is an integer. According to the phase shift optical mask of the present invention, it is possible to correct a defective portion by simple processes and the production yield of the phase shift optical mask can be improved. In addition, the corrected portion which is formed by removing the defective portion does not affect the exposure from the practical point of view.

Still another object of the present invention is to provide method of correcting defects in a phase shift optical mask which includes a transparent substrate, a phase shifter shifting a phase of the exposure light with respect to the phase of the exposure light transmitted through the transparent substrate, and a transparent layer interposed between the transparent substrate and the phase shifter, the transparent layer shifting the phase of the exposure light by 90°+180°·n, where n is an integer and the method comprises the steps of (a) removing a portion of the phase shifter which includes a defective portion together with the transparent layer underneath so as to form an opening in tile phase shifter and the transparent layer, and (b) forming a new phase shifter portion within the opening from a material which shifts the phase of the exposure light by the same amount as the phase shifter. According to the method of the present invention, it is possible to remove by the defective portion using simple processes.

A further object of the present invention is to provide a method of correcting defects in a phase shift optical mask which includes a transparent substrate, a phase shifter shifting a phase of the exposure light with respect to the phase of the exposure light transmitted through the transparent substrate, and a transparent layer interposed between the transparent substrate and the phase shifter, the transparent layer shifting the phase of the exposure light by 90°+180°·n, where n is an integer and the method comprises the steps of (a) removing an unwanted residual portion of the phase shifter forming the defect together with the transparent layer underneath so as to form an opening in the transparent layer, and (b) forming a new transparent layer portion within the opening from a material which shifts the phase of the exposure light by the same amount as the transparent layer. According to the method of the present invention, it is possible to remove by the defective portion using simple processes.

Other objects and further features of the present invention will be apparent from the following detailed description when read in conjunction with the accompanying drawings.

DESCRIPTION OF THE PREFERRED EMBODIMENTS

Figure 1:
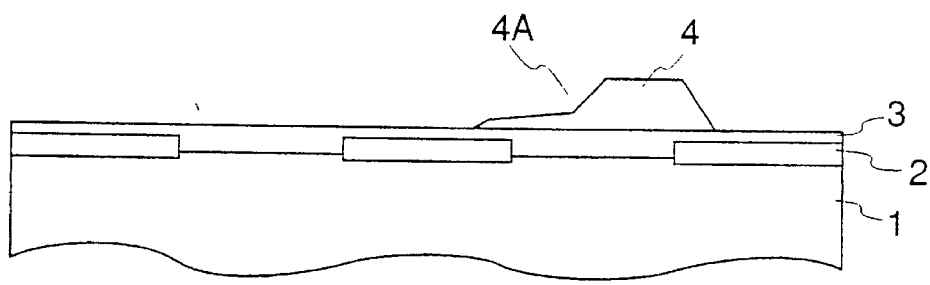
FIG. 1 is a cross sectional view showing an essential part of a phase shift optical mask at an essential stage of an example of a conventional method of correcting a defect of the phase shift optical mask.
Figure 2:
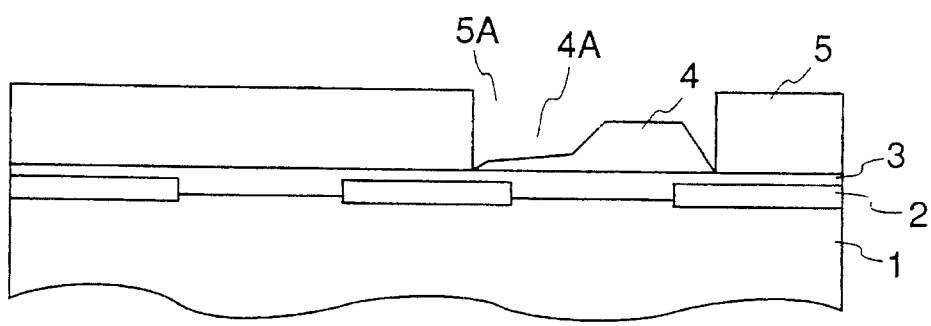
FIG. 2 is a cross sectional view showing an essential part of the phase shift optical mask at an essential stage of the example of the conventional method of correcting the defect of the phase shift optical mask.
Figure 3:
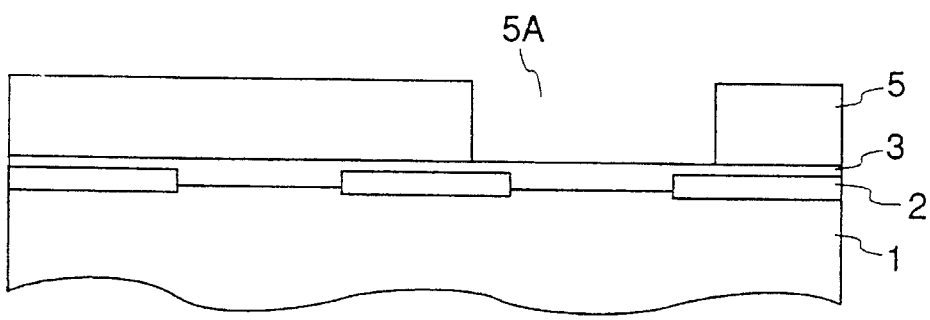
FIG. 3 is a cross sectional view showing an essential part of the phase shift optical mask at an essential stage of the example of the conventional method of correcting the defect of the phase shift optical mask.
Figure 4:
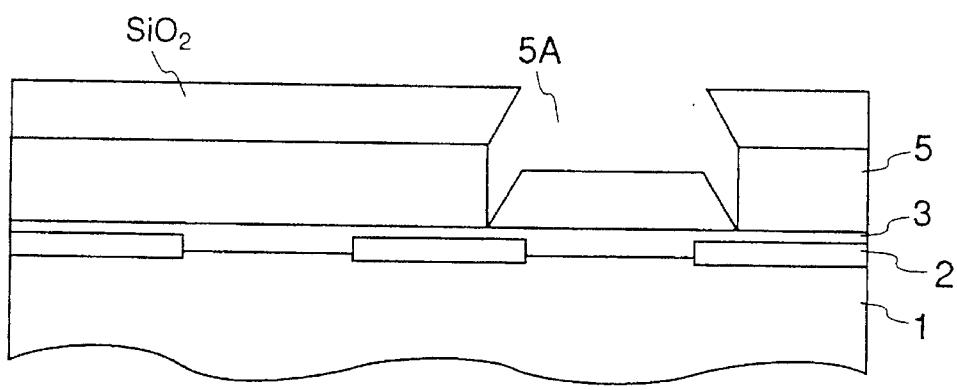
FIG. 4 is a cross sectional view showing an essential part of the phase shift optical mask at an essential stage of the example of the conventional method of correcting the defect of the phase shift optical mask.
Figure 5:
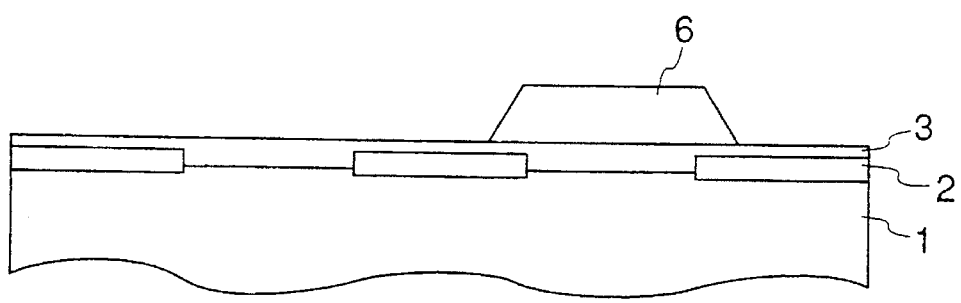
FIG. 5 is a cross sectional view showing an essential part of the phase shift optical mask at an essential stage of the example of the conventional method of correcting the defect of the phase shift optical mask.
Figure 6:
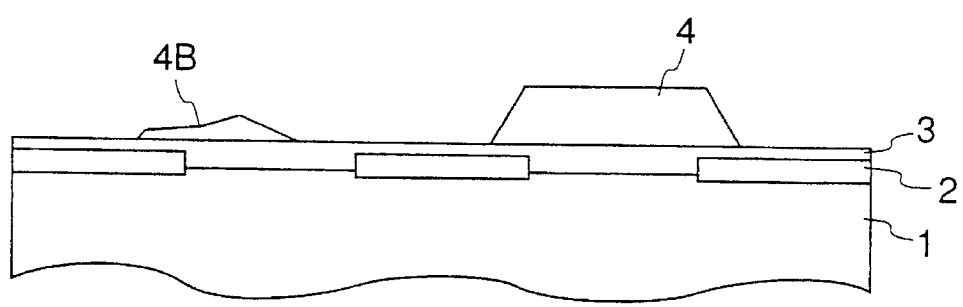
FIG. 6 is a cross sectional view showing an essential part of the phase shift optical mask at an essential stage of the example of the conventional method of correcting a defect of the phase shift optical mask different from those corrected in FIGS.1 through 5.
Figure 7:
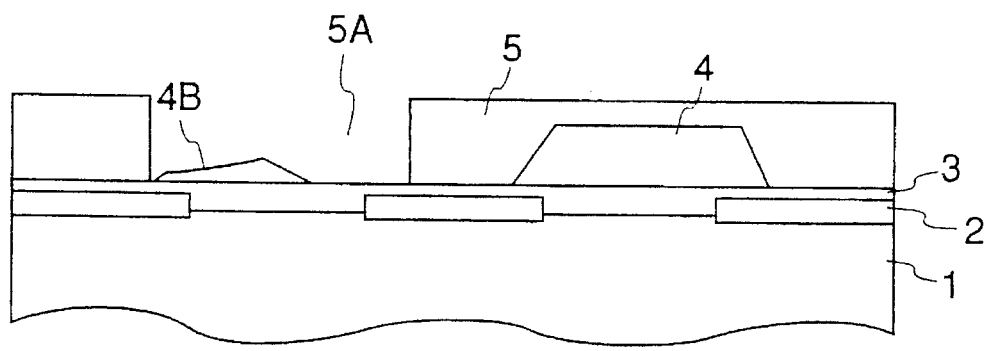
FIG. 7 is a cross sectional view showing an essential part of the phase shift optical mask at an essential stage of the example of the conventional method of correcting the defect of the phase shift optical mask different from those corrected in FIGS. 1 through 5.
Figure 8:
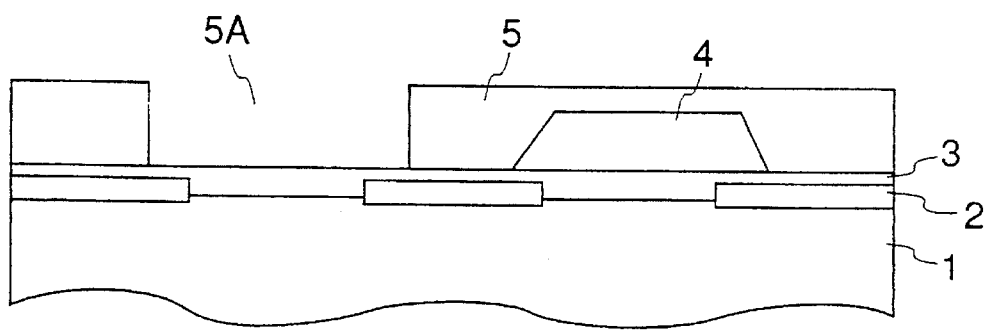
FIG. 8 is a cross sectional view showing an essential part of the phase shift optical mask at an essential stage of the example of the conventional method of correcting the defect of the phase shift optical mask different from those corrected in FIGS. 1 through 5.
Figure 9:
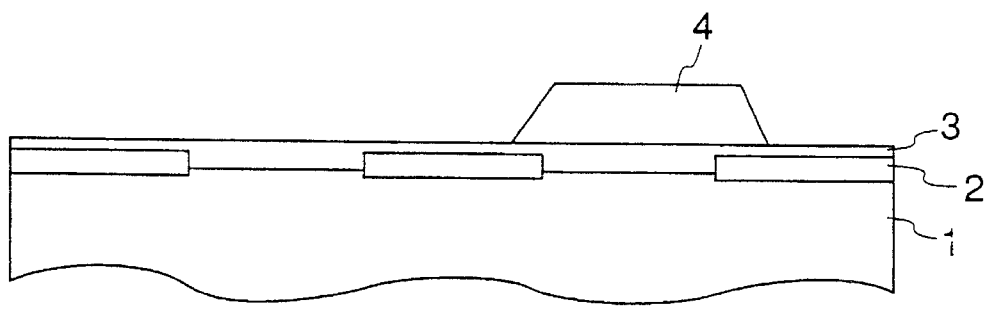
FIG. 9 is a cross sectional view showing an essential part of the phase shift optical mask at an essential stage of the example of the conventional method of correcting the defect of the phase shift optical mask different from those corrected in FIGS. 1 through 5.
Figure 10:
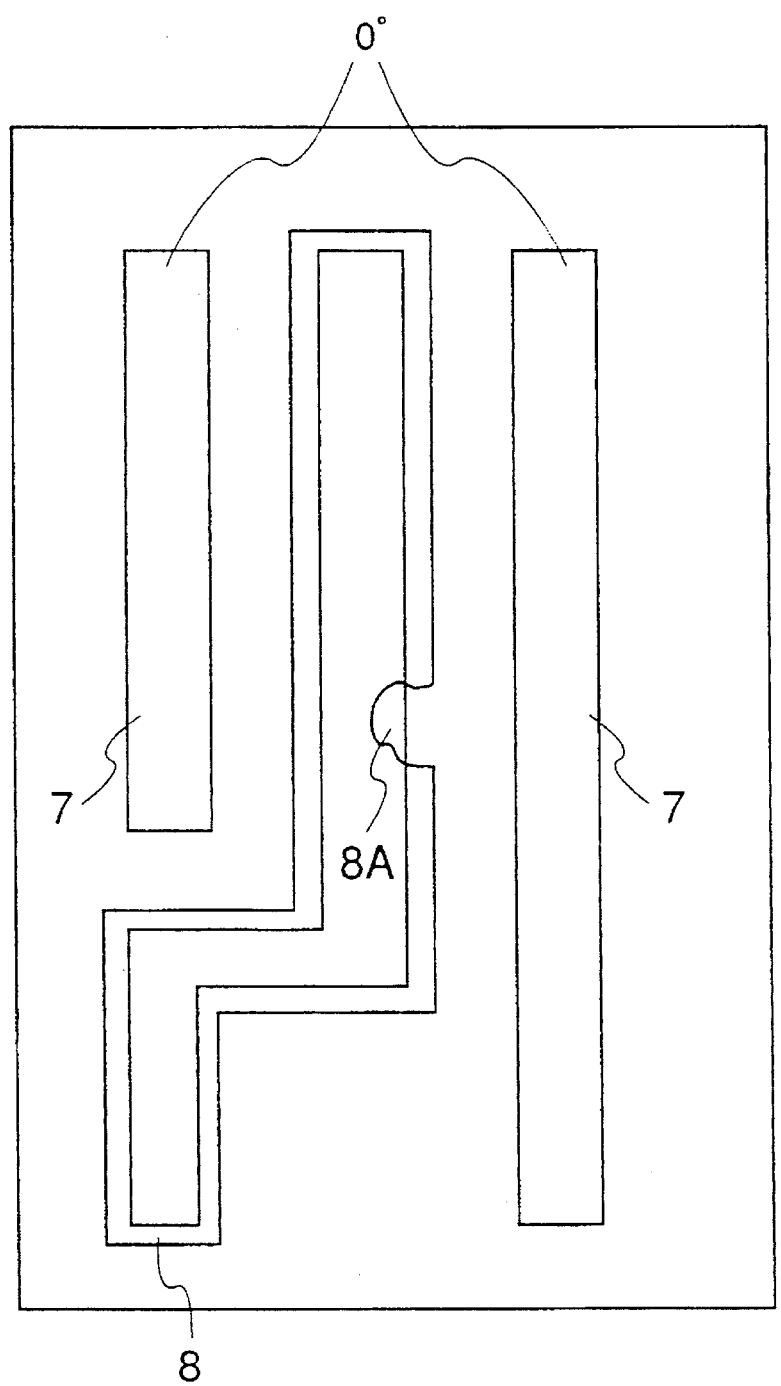
FIG. 10 is a plan view for explaining a first method of correcting the defect of the phase shift optical mask described with reference to FIGS. 1 through 5.
Figure 11:
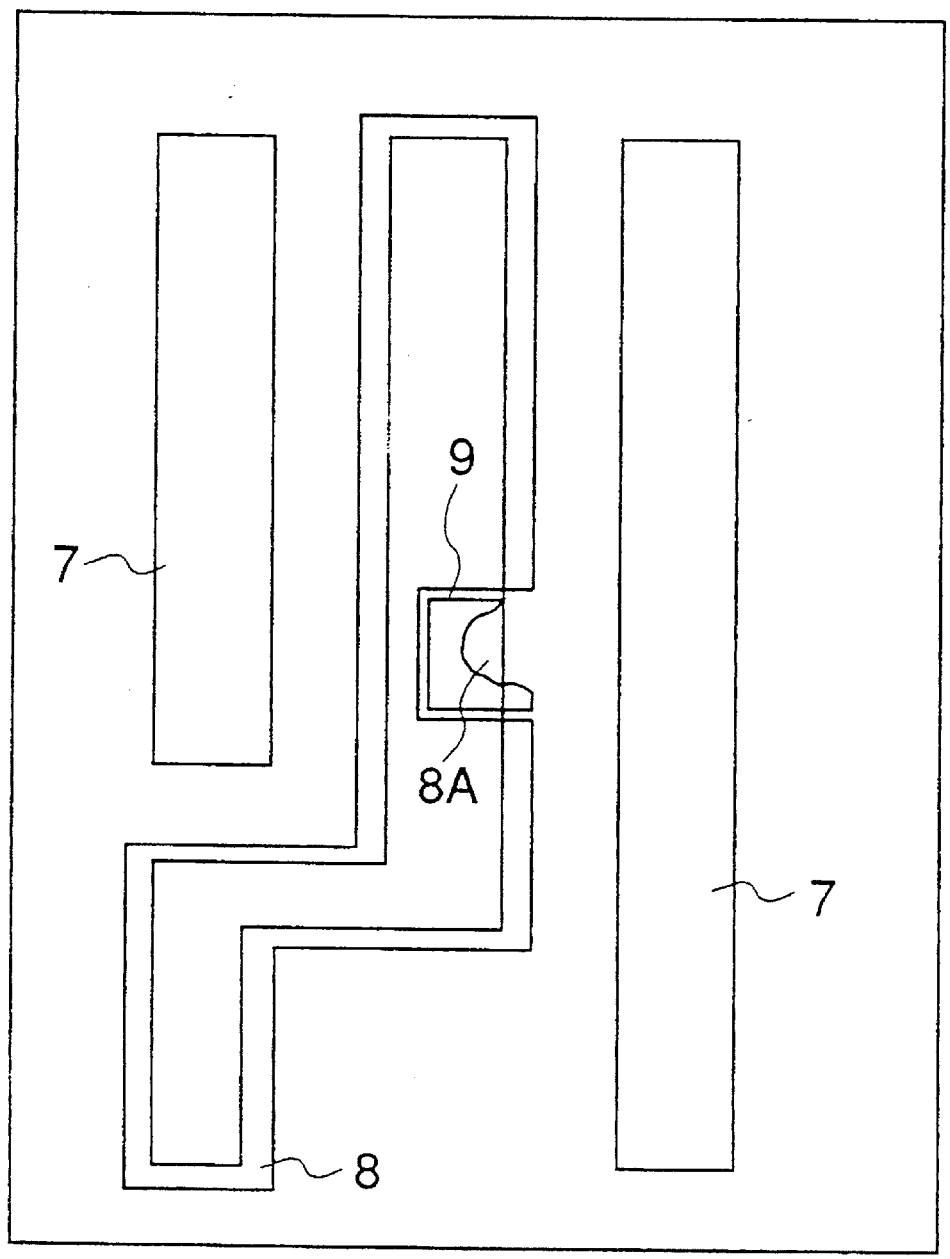
FIG. 11 is a plan view for explaining a second method of correcting the defect of the phase shift optical mask described with reference to FIGS. 1 through 5.
Figure 12:
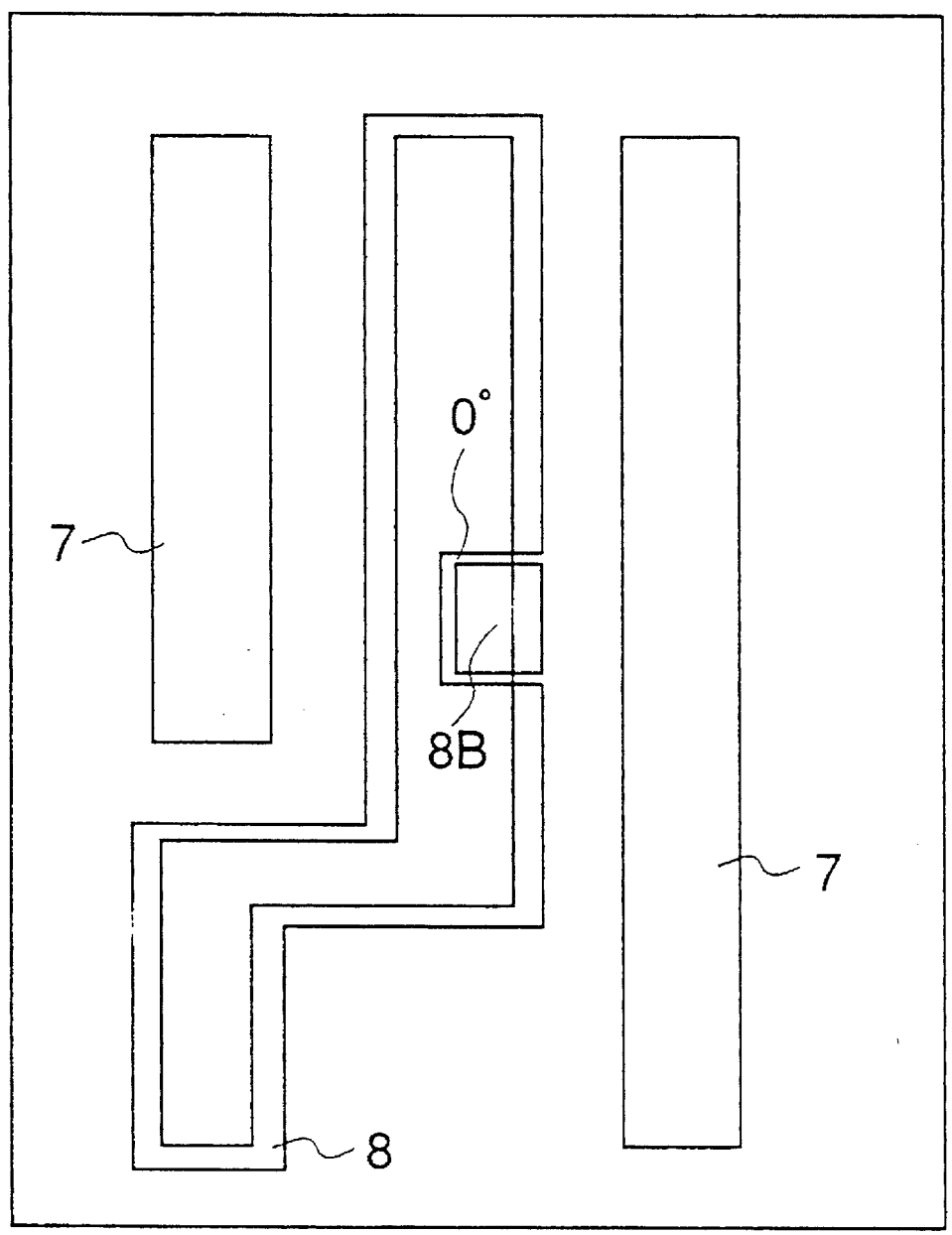
FIG. 12 is a plan view for explaining the second method of correcting the defect of the phase shift optical mask described with reference to FIGS. 1 through 5.
Figure 13:
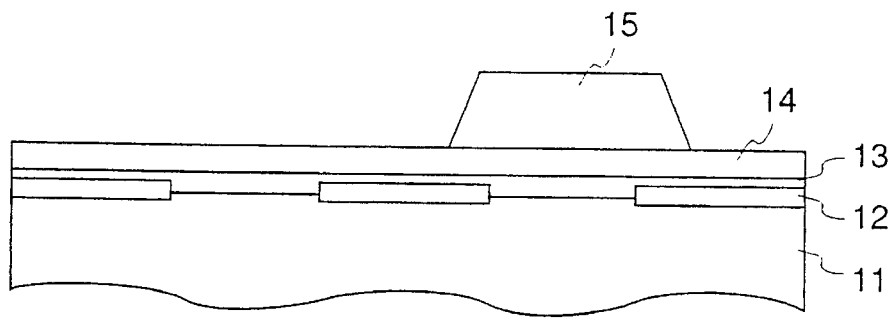
FIG. 13 is a cross sectional view showing an essential part of a first embodiment of a phase shift optical mask according to the present invention.

FIG. 13 is a cross sectional view showing an essential part of a first embodiment of a phase shift optical mask according to the present invention.

The phase shift optical mask shown in FIG. 13 includes a quartz substrate 11 which is transparent, a Cr light blocking pattern layer 12 having a thickness of 800 Å, for example, an etching stopper layer 13 made of aluminum oxide, for example, a $SiO_2$ transparent layer 14 for providing a 90° phase shift, for example, and a $SiO_2$ phase shifter 15 for providing a 180° phase shift, for example.

Figure 14:
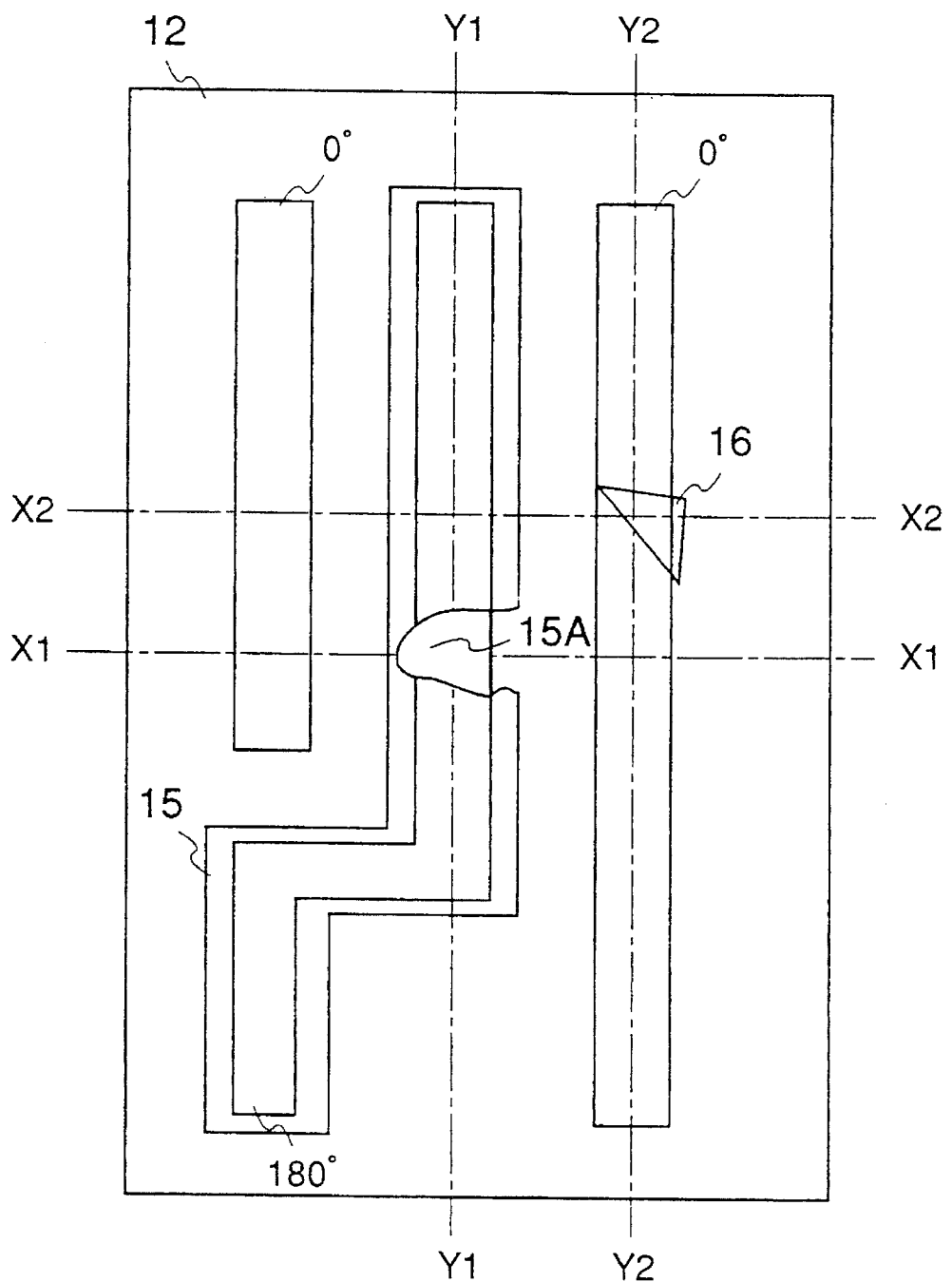
FIG. 14 is a plan view showing an essential part of the phase shift optical mask shown in FIG. 13 at an essential stage of a first embodiment of a method of correcting defects in the optical mask according to the present invention.

A description will be given of a first embodiment of a method of correcting defects of the phase shift optical mask shown in FIG. 13, by referring to FIGS. 14 through 24. FIG. 14 is a plan view showing an essential part of the phase shift optical mask shown in FIG. 13 at an essential stage of the first embodiment of the method according to the present invention. FIGS. 15 through 19 are cross sectional views showing essential parts of the phase shift optical mask shown in FIG. 13 at essential stages of the first embodiment of the method along a line X1—X1 in FIG. 14. FIGS. 20 through 24 are cross sectional views showing essential parts of the phase shift optical mask shown in FIG. 13 at essential stages of the first embodiment of the method along a line Y1—Y1 in FIG. 14. It is assumed that the defect generated in the phase shifter itself (that is, a portion of the phase shifter is missing) is corrected, and that a reference is made to FIG. 14 in the following description related to the first embodiment of the method although not explicitly mentioned.

Figure 15:
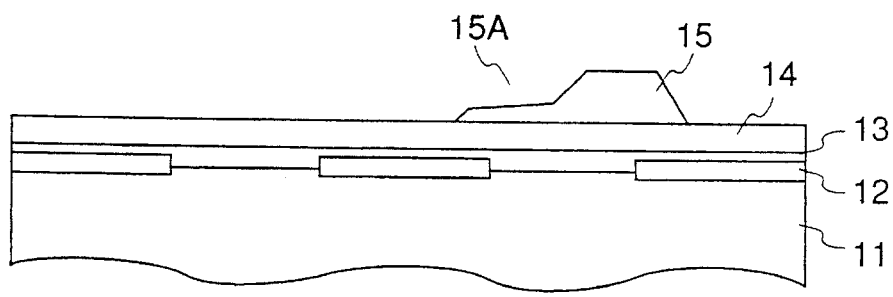
FIG. 15 is a cross sectional view showing an essential part of tile phase shift optical mask shown in FIG. 13 at an essential stage of the first embodiment of the method of correcting defects in the optical mask according to the present invention.
Figure 20:
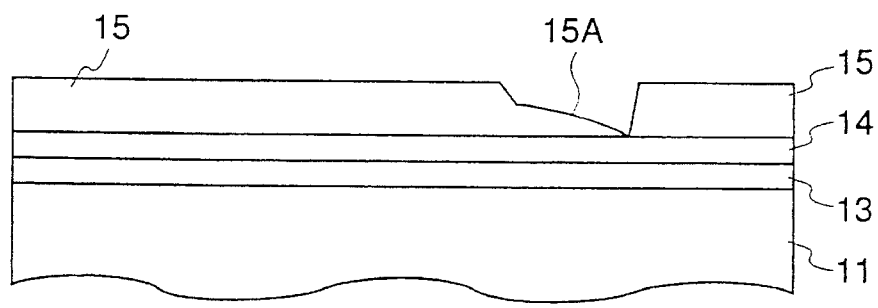
FIG. 20 is a cross sectional view showing an essential part of tile phase shift optical mask shown in FIG. 13 at an essential stage of the first embodiment of the method of correcting defects in the optical mask according to the present invention.

As shown in FIGS. 15 and 20, the optical mask is made using the normal techniques by forming a Cr light blocking pattern layer 12 on the quartz substrate 11 and forming an etching stopper layer 13 which covers the light blocking pattern layer 12. The etching stopper layer 13 is made of aluminum oxide and has a thickness of 1100 Å, for example.

A $SiO_2$ transparent layer 14 having a thickness of approximately 1900 Å, for example, is formed on the etching stopper layer 13 using evaporation. This transparent layer 14 provides a 90° phase shift if an i-line having a wavelength of 365 no is used as the exposure light.

A $SiO_2$ phase shifter 15 having a thickness of 3800 Å, for example, is formed on the transparent layer 14 using the resist process of the lithography technique, evaporation and lift-off, to complete the phase shift optical mask. However, it is assumed that a defective portion 15A is formed in the phase shifter 15. The phase shifter 15 normally provides a 180° phase shift if the i-line is used.

Figure 16:
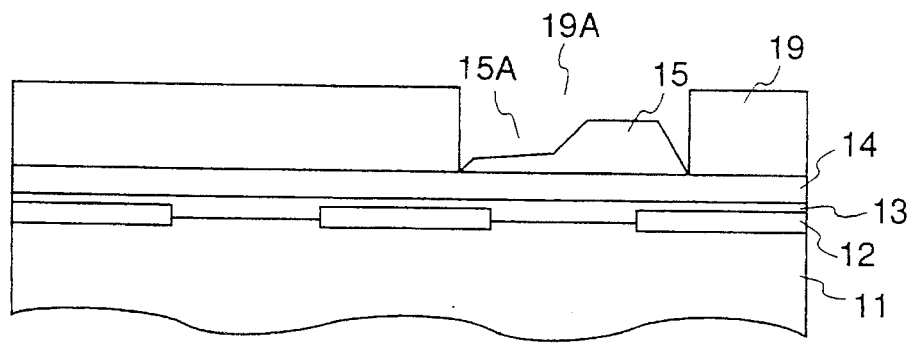
FIG. 16 is a cross sectional view showing an essential part of the phase shift optical mask shown in FIG. 13 at an essential stage of the first embodiment of the method of correcting defects in the optical mask according to the present invention.
Figure 21:
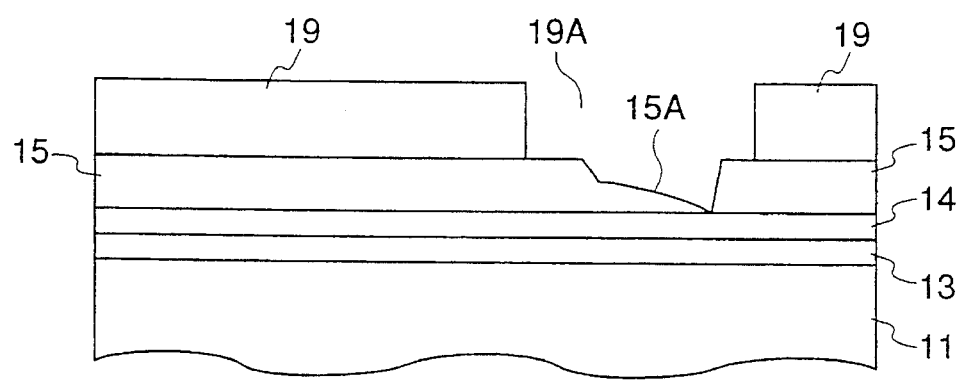
FIG. 21 is a cross sectional view showing an essential part of the phase shift optical mask shown in FIG. 13 at an essential stage of the first embodiment of the method of correcting defects in the optical mask according to the present invention.

In FIGS. 16 and 21, a resist layer 19 having an opening 19A for exposing the phase shifter 15 having the defective portion 15A is formed using the resist process of the lithography technique.

Figure 17:
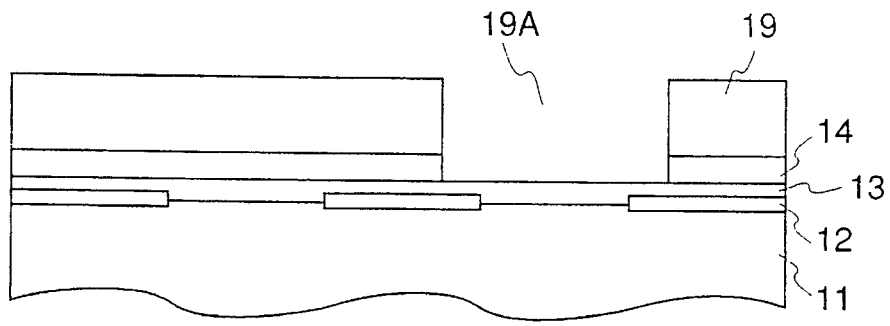
FIG. 17 is a cross sectional view showing an essential part of the phase shift optical mask shown in FIG. 13 at an essential stage of the first embodiment of the method of correcting defects in the optical mask according to the present invention.
Figure 22:
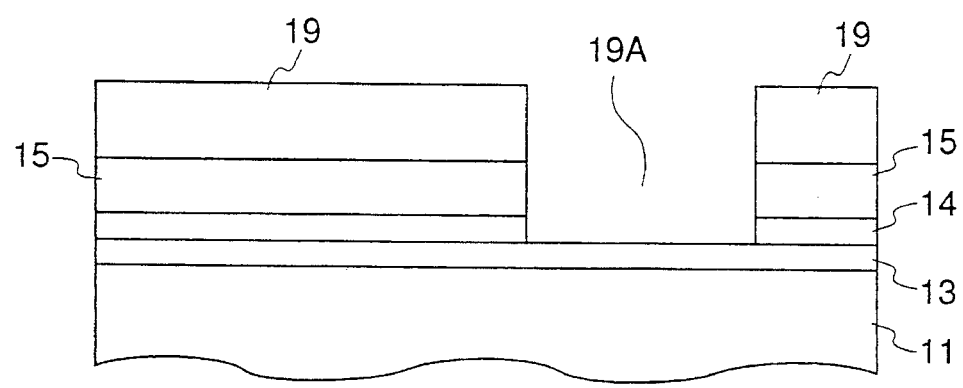
FIG. 22 is a cross sectional view showing an essential part of the phase shift optical mask shown in FIG. 13 at an essential stage of the first embodiment of the method of correcting defects in the optical mask according to the present invention.

In FIGS. 17 and 22, the resist layer 19 is used as a mask to remove the phase shifter 15 having the defective portion 15A and the transparent layer 14 which are exposed within the opening 19A by an etching process. This etching process may be a wet etching using buffered hydrofluoric acid as the etchant or, a dry etching using a $CF_4$ system gas as the etching gas. As a result of this etching process, a portion of the etching stopper layer 13 is exposed within the opening 19A.

Figure 18:
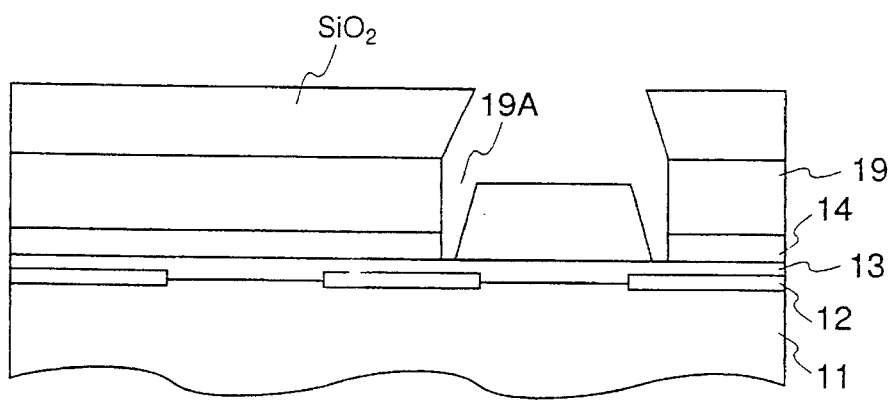
FIG. 18 is a cross sectional view showing an essential part of the phase shift optical mask shown in FIG. 13 at an essential stage of the first embodiment of the method of correcting defects in the optical mask according to the present invention.
Figure 23:
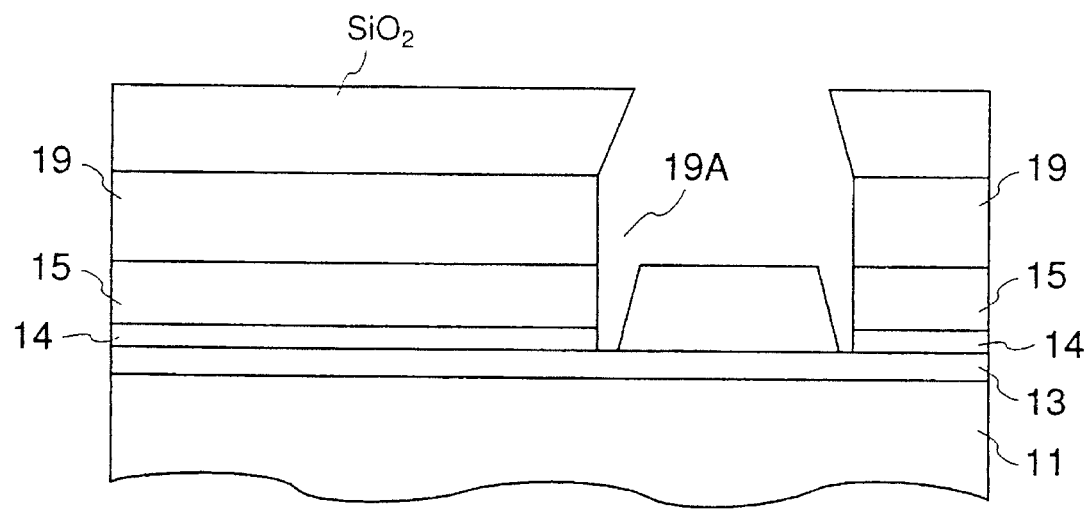
FIG. 23 is a cross sectional view showing an essential part of the phase shift optical mask shown in FIG. 13 at an essential stage of the first embodiment of the method of correcting defects in the optical mask according to the present invention.

In FIGS. 18 and 23, a $SiO_2$ layer having a thickness of 5700 Å, for example, is formed by evaporation with the resist layer 19 having the opening 19A remaining.

Figure 19:
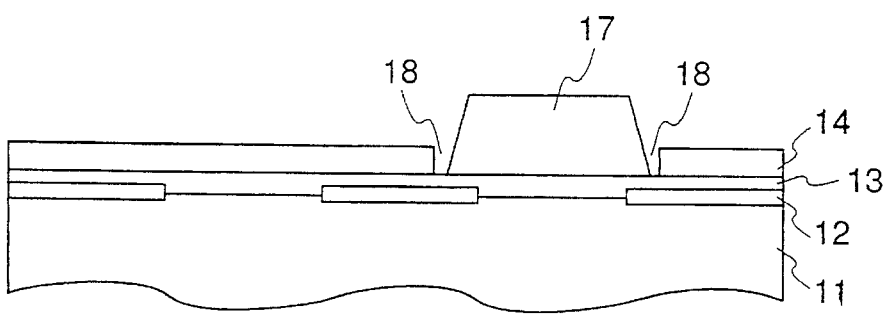
FIG. 19 is a cross sectional view showing an essential part of the phase shift optical mask shown in FIG. 13 at an essential stage of the first embodiment of the method of correcting defects in the optical mask according to the present invention.
Figure 24:
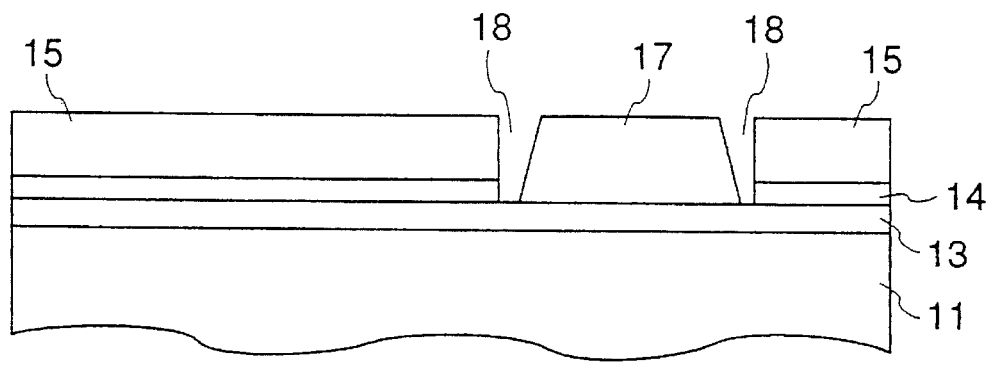
FIG. 24 is a cross sectional view showing an essential part of the phase shift optical mask shown in FIG. 13 at an essential stage of the first embodiment of the method of correcting defects in the optical mask according to the present invention.

In FIGS. 19 and 24, the entire structure is submerged in a resist removing solution so as to remove the resist layer 19 having the $SiO_2$ layer formed thereon in the previous step by lift-off, and the $SiO_2$ layer is patterned to form a new phase shifter 17. Since this new phase shifter 17 has the thickness of 5700 Å as described above, this new phase shifter 17 provides a 270° phase shift if the i-line is used.

In this embodiment, a connecting portion 18 is formed between the phase shifter 15 and the new phase shifter 17 by correcting the defective portion 15A of the phase shifter 15. Hence, this connecting portion 18 may be regarded as a phase defect.

If a light transmitting portion only having the transparent layer 14 is taken as a 0° transmitting portion, a light transmitting portion having the phase shifter 15 or the new phase shifter 17 may be taken as a 180° transmitting portion with respect to the 0° transmitting portion. For this reason, the connecting portion 18 which has no transparent layer 14 and may be regarded as the phase defect is in effect a −90° (or 90°) transmitting portion with respect to the 0° transmitting portion.

Figure 25:
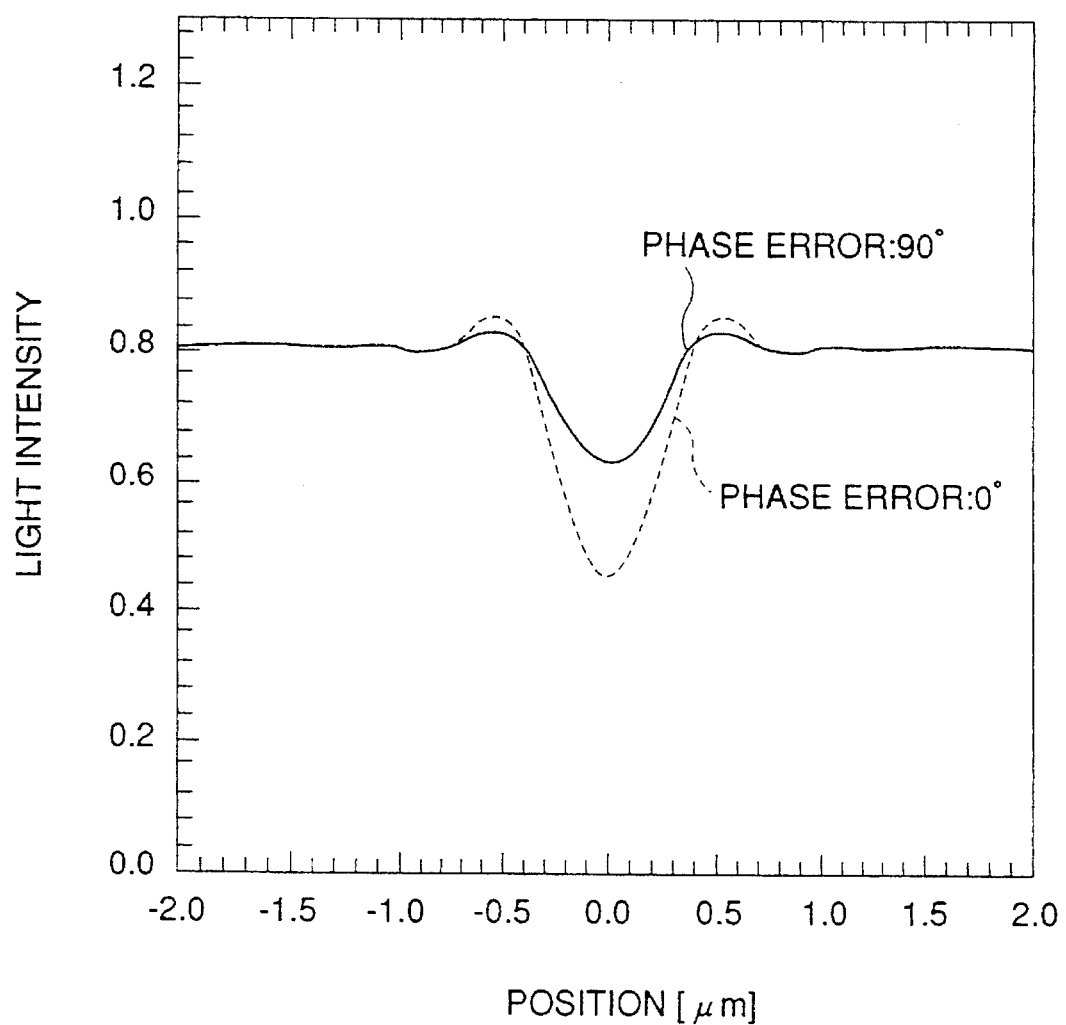
FIG. 25 is a diagram showing the relationship between the light intensity and position for explaining a light intensity distribution in a vicinity of a corrected portion when a defective portion generated in a phase shifter itself is corrected by the first embodiment of the method of correcting defects in the optical mask according to the present invention.

FIG. 25 is a diagram showing the relationship between the light intensity and position for explaining a light intensity distribution in a vicinity of a corrected portion when a defective portion generated in a phase shifter itself is corrected by the first embodiment of the method of correcting defects in the optical mask according to the present invention. In FIG. 25, the ordinate indicates the light intensity and the abscissa indicates the position. In addition, a position 0.0 on the abscissa may be regarded as the center of the connecting portion 18.

In FIG. 25, a solid line indicates the characteristic which is obtained when the defective portion 15A of the phase shifter 15 is corrected according to the first embodiment of the method. In this case, the phase error at the connecting portion 18 where the phase defect exists is 90° with respect to the 0° transmitting portion. On the other hand, a dotted line indicates the characteristic which is obtained when the defective portion of the phase shifter is corrected by a method other than the first embodiment of the method. In this latter case, the phase error at the connecting portion (or boundary) is 0° with respect to the 0° transmitting portion.

Figure 26:
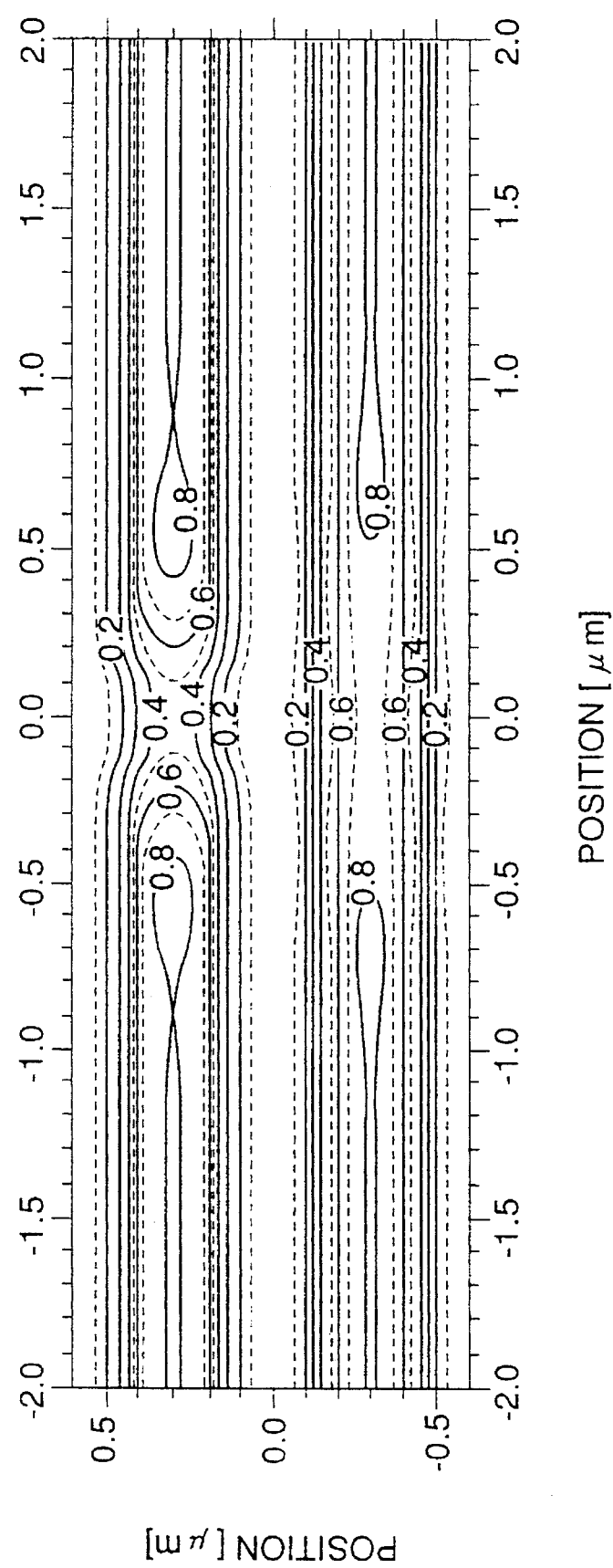
FIG. 26 is a diagram showing the relationship between the light intensity and position for explaining a light intensity distribution in a vicinity of a corrected portion when the defective portion generated in the phase shifter itself is corrected by a method other than the method of correcting defects in the optical mask according to the present invention.

FIG. 26 is a diagram showing the relationship between the light intensity and position for explaining a light intensity distribution in a vicinity of a corrected portion when the defective portion generated in the phase shifter itself is corrected by a method other than the method of correcting defects in the optical mask according to the present invention. In FIG. 26, the ordinate and abscissa indicate the positions, and the light intensity is indicated by contour lines.

The data shown in FIG. 26 shows by the contour lines the light intensity on the wafer surface, that is, the light intensity distribution of the projection image of the mask, when the exposure is made using a phase shift optical mask similar to that shown in FIG. 19 or 24 but the phase error at the connecting portion (or boundary) is 0° with respect to the 0° transmitting portion. The light intensity is normalized using the light intensity at a sufficiently large light transmitting portion.

In FIG. 26, a position 0.0 on the abscissa indicates a center of the connecting portion which has the 0° phase error with respect to the 0° transmitting portion, and it may be seen that the light intensity decreases to approximately 0.4 at the connecting portion which has the phase defect. Normally, the positive resist is developed if the light intensity is approximately 0.3 or greater at the time of the exposure, and a pattern is accordingly formed. Hence, between the upper group of contour lines and the lower group of contour lines, the upper group of contour lines is constricted at the connecting portion which has the phase error. Actually, since the light intensity is decreased to approximately 0.4 due to the above phase error, the upper group of contour lines is constricted to a greater extent than shown in FIG. 26, and the patterns will be cut if the wafer position deviates from a focal position of a lens system of the exposure apparatus (or stepper). FIG. 26 shows a state where the wafer position matches the focal position of the lens system of the stepper.

Figure 27:
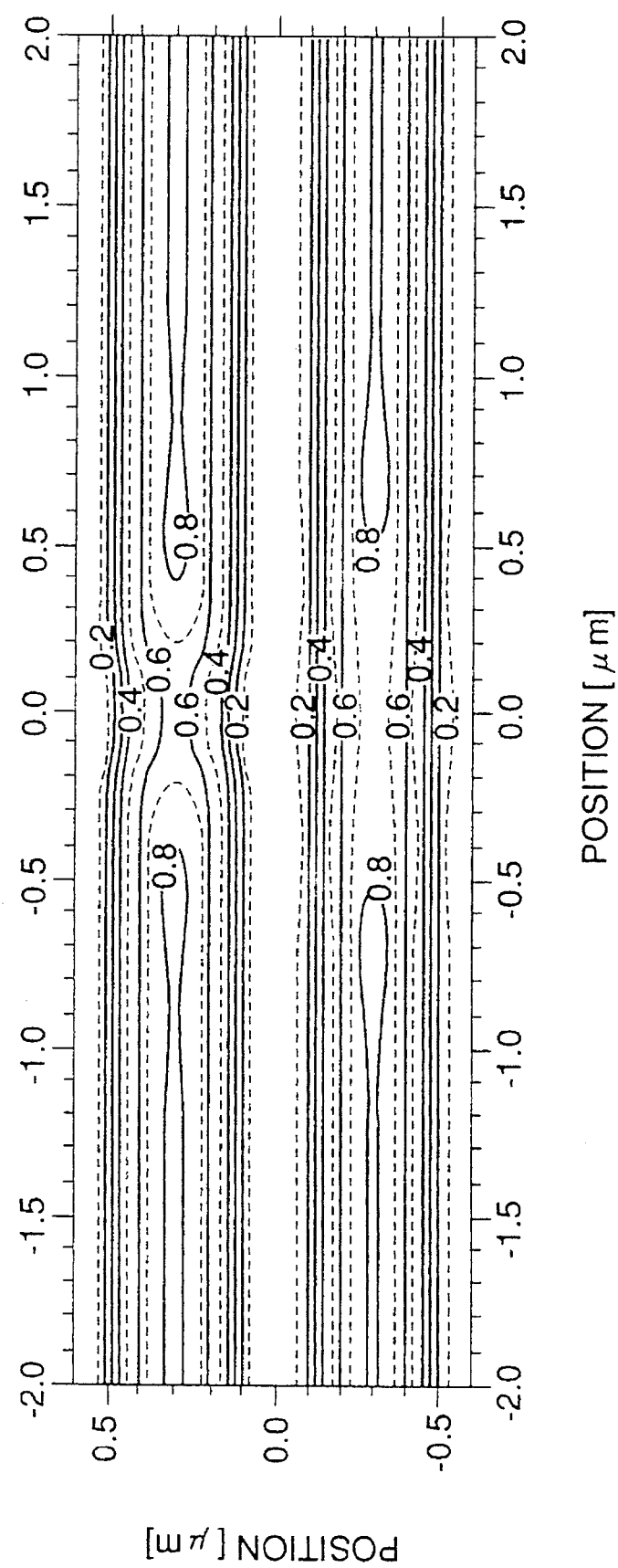
FIG. 27 is a diagram showing the relationship between the light intensity and position for explaining a light intensity distribution in a vicinity of the corrected portion when the defective portion generated in the phase shifter itself is corrected by the first embodiment of the method of correcting defects in the optical mask according to the present invention.

FIG. 27 is a diagram showing the relationship between the light intensity and position for explaining a light intensity distribution in a vicinity of a corrected portion when the defective portion generated in the phase shifter itself is corrected by the first embodiment of the method of correcting defects in the optical mask according to the present invention. In FIG. 27, the ordinate and abscissa indicate the positions, and the light intensity is indicated by contour lines.

The data shown in FIG. 27 shows by the contour lines the light intensity on the wafer surface, that is, the light intensity distribution of the projection image of the mask, when the exposure is made using a phase shift optical mask shown in FIG. 19 or 24. The light intensity is normalized using the light intensity at a sufficiently large light transmitting portion.

In FIG. 27, a position 0.0 on the abscissa indicates a center of the connecting portion 18 which has the 90° phase error with respect to the 0° transmitting portion, and it may be seen that the light intensity at the connecting portion 18 which has the phase defect is approximately 0.6. As may be readily seen by looking at the contour line indicating the light intensity of 0.3, the group of contour lines is virtually not constricted at the connecting portion 18.

Compared to the phase shift optical mask with the connecting portion having the 0° phase error with respect to the 0° transmitting portion, the phase shift optical mask with the connecting portion 18 having the 90° phase error with respect to the 0° transmitting portion has a smaller deterioration (decrease) in the light intensity at the connecting portion 18. The reason for this improved light intensity at the connecting portion 18 may be understood if the diffracted lights on the wafer is considered when the lights transmitted through the connecting portion 18 and its vicinity having the 180° phase error with respect to the 0° transmitting portion reach the wafer.

For example, if the connecting portion 18 which is the 90° transmitting portion is taken as the center in FIG. 24, the phase shifters 15 and 17 which are 180° transmitting portions exist on the right and left (or vice versa). The diffracted lights reaching the wafer after transmitting through the connecting portion 18 and the phase shifters 15 and 17 add up to the combined amplitude of the diffracted lights, and a square of this combined amplitude is equal to the light intensity.

If the connecting portion were the 0° transmitting portion, this would lead to a diffracted light having an inverted phase with respect to the phase of the diffracted lights which have transmitted through the phase shifters 15 and 17 which are 180° transmitting portions. As a result, the combined amplitude of the diffracted lights will decrease.

On the other hand, according to this embodiment, the connecting portion 18 is the 90° transmitting portion. Hence, if the diffracted light which has transmitted through this connecting portion 18 and the diffracted lights which have transmitted through the 180° transmitting portions (phase shifters 15 and 17) are combined, the combined amplitude of the diffracted lights becomes large. This is evident if the amplitudes of the diffracted lights are described by vectors and combined.

A description will be given of a second embodiment of the method of correcting defects of the phase shift optical mask shown in FIG. 13, by referring to FIGS. 28 through 37. FIGS. 28 through 32 are cross sectional views showing essential parts of the phase shift optical mask shown in FIG. 18 at essential stages of the second embodiment of the method along a line X2—X2 in FIG. 14. FIGS. 33 through 37 are cross sectional views showing essential parts of the phase shift optical mask shown in FIG. 13 at essential stages of the second embodiment of the method along a line Y2—Y2 in FIG. 14. It is assumed that the defect generated by the phase shifter layer (that is, the phase shifter layer exists at an unwanted portion) is corrected, and that a reference is made to FIG. 14 in the following description related to the first embodiment of the method although not explicitly mentioned.

Figure 28:
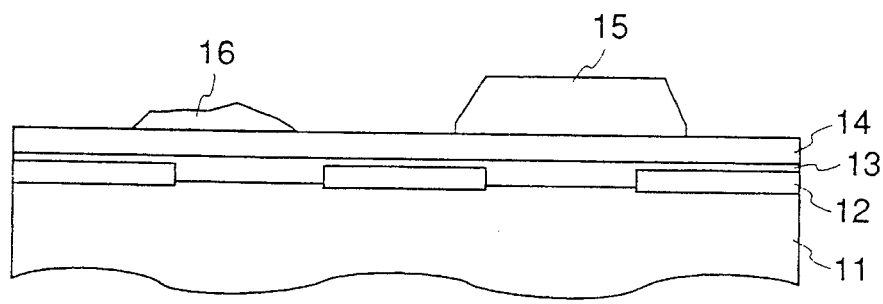
FIG. 28 is a plan view showing an essential part of the phase shift optical mask shown in FIG. 13 at an essential stage of a second embodiment of a method of correcting defects in the optical mask according to the present invention.
Figure 33:
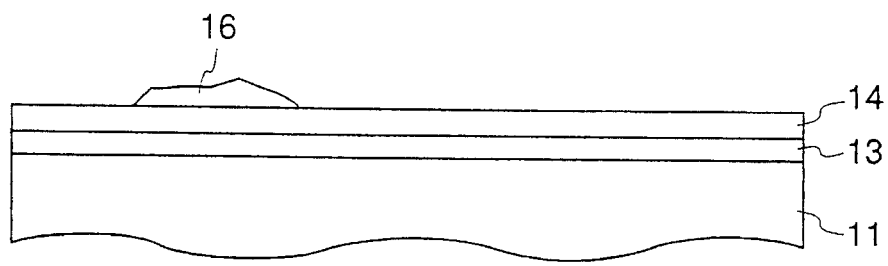
FIG. 33 is a cross sectional view showing an essential part of the phase shift optical mask shown in FIG. 13 at an essential stage of the second embodiment of the method of correcting defects in the optical mask according to the present invention.

As shown in FIGS. 28 and 33, the optical mask is made using the normal techniques by forming a Cr light blocking pattern layer 12 on the quartz substrate 11 and forming an etching stopper layer 13 which covers the light blocking pattern layer 12. The etching stopper layer 13 is made of aluminum oxide and has a thickness of 1100 Å, for example.

A $SiO_2$ transparent layer 14 having a thickness of approximately 1900 Å, for example, is formed on the etching stopper layer 13 using evaporation. This transparent layer 14 provides a 90° phase shift if an i-line having a wavelength of 365 nm is used as the exposure light.

A $SiO_2$ phase shifter 15 having a thickness of 3800 Å, for example, is formed on the transparent layer 14 using the resist process of the lithography technique, evaporation and lift-off, to complete the phase shift optical mask. However, it is assumed that a residual portion 16 of the phase shifter 15 is formed at an unwanted position on the transparent layer 14. In other words, the residual portion 16 is formed at a portion where the phase shifter 15 originally should not exist. The phase shifter 15 normally provides a 180° phase shift if the i-line is used.

Figure 29:
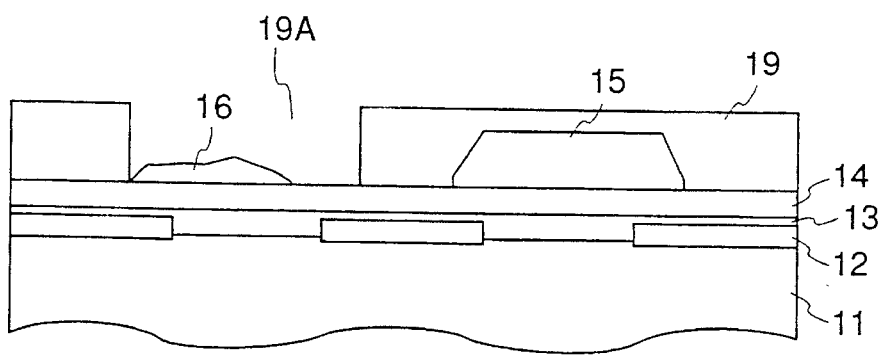
FIG. 29 is a cross sectional view showing an essential part of the phase shift optical mask shown in FIG. 13 at an essential stage of the second embodiment of the method of correcting defects in the optical mask according to the present invention.
Figure 34:
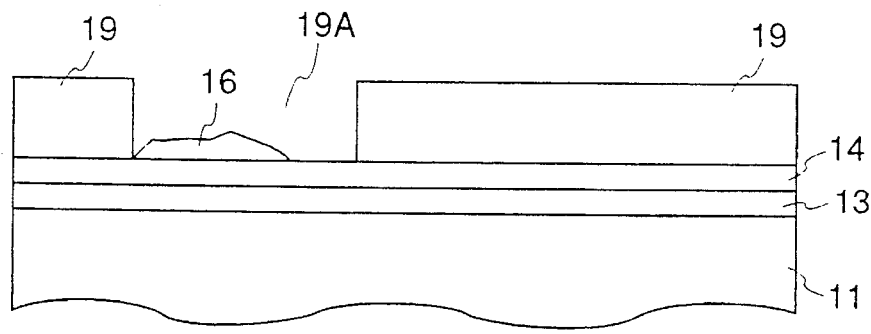
FIG. 34 is a cross sectional view showing an essential part of the phase shift optical mask shown in FIG. 13 at an essential stage of the second embodiment of the method of correcting defects in the optical mask according to the present invention.

In FIGS. 29 and 34, a resist layer 19 having an opening 19A for exposing the residual portion 16 which is made of the phase shifter material is formed using the resist process of the lithography technique.

Figure 30:
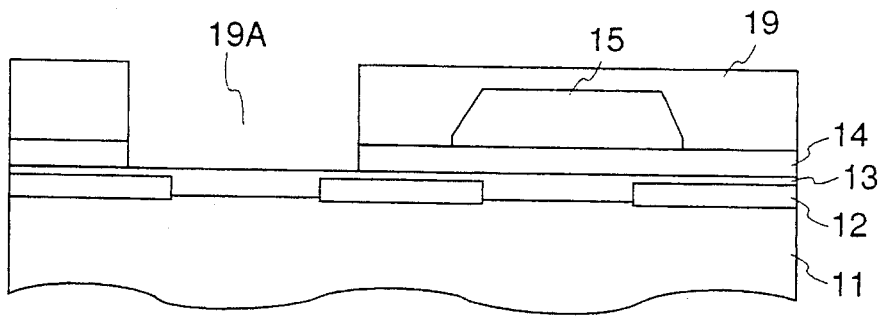
FIG. 30 is a cross sectional view showing an essential part of the phase shift optical mask shown in FIG. 13 at an essential stage of the second embodiment of the method of correcting defects in the optical mask according to the present invention.
Figure 35:
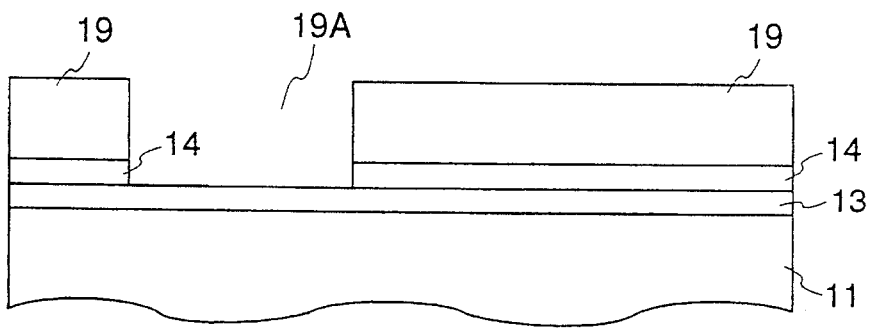
FIG. 35 is a cross sectional view showing an essential part of the phase shift optical mask shown in FIG. 13 at an essential stage of the second embodiment of the method of correcting defects in the optical mask according to the present invention.

In FIGS. 30 and 35, the resist layer 19 is used as a mask to remove the residual portion 16 and the transparent layer 14 which are exposed within the opening 19A by an etching process. This etching process may be a wet etching using buffered hydrofluoric acid as the etchant. As a result of this etching process, a portion of the etching stopper layer 13 is exposed within the opening 19A.

Figure 31:
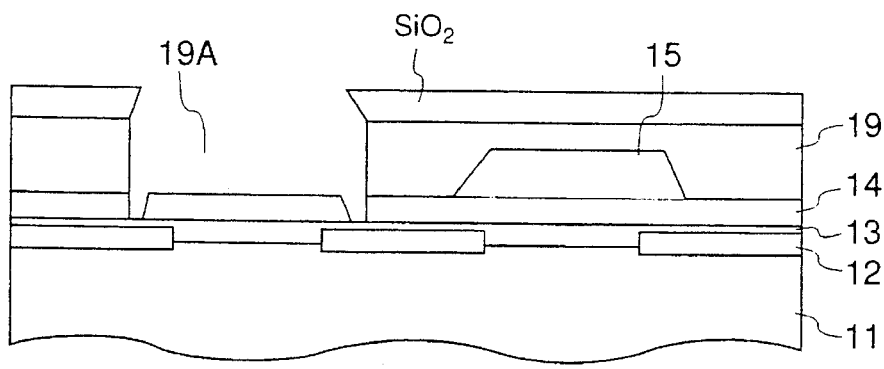
FIG. 31 is a cross sectional view showing an essential part of the phase shift optical mask shown in FIG. 13 at an essential stage of the second embodiment of the method of correcting defects in the optical mask according to the present invention.
Figure 36:
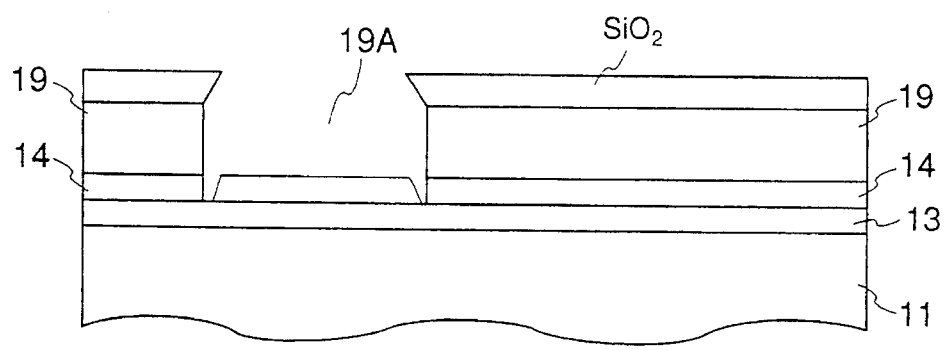
FIG. 36 is a cross sectional view showing an essential part of the phase shift optical mask shown in FIG. 13 at an essential stage of the second embodiment of the method of correcting defects in the optical mask according to the present invention.

In FIGS. 31 and 36, a $SiO_2$ layer having a thickness of 1900 Å, for example, is formed by evaporation with the resist layer 19 having the opening 19A remaining.

Figure 32:
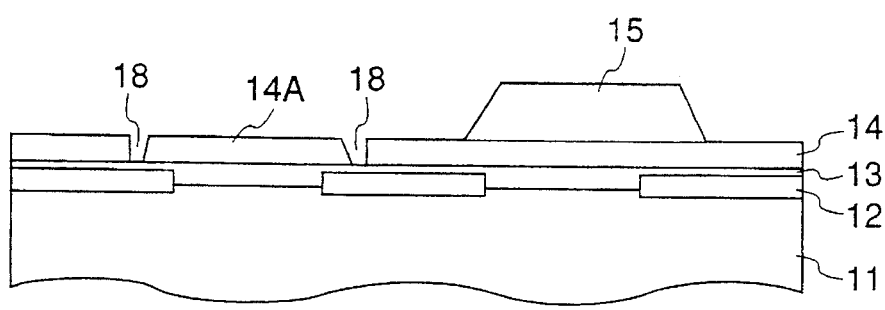
FIG. 32 is a cross sectional view showing an essential part of the phase shift optical mask shown in FIG. 13 at an essential stage of the second embodiment of the method of correcting defects in the optical mask according to the present invention.
Figure 37:
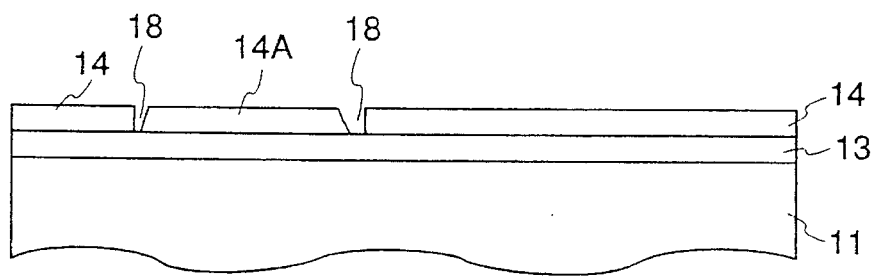
FIG. 37 is a cross sectional view showing an essential part of the phase shift optical mask shown in FIG. 13 at an essential stage of the second embodiment of the method of correcting defects in the optical mask according to the present invention.

In FIGS. 32 and 37, the entire structure is submerged in a resist removing solution so as to remove the resist layer 19 having the $SiO_2$ layer formed thereon in the previous step by lift-off, and the $SiO_2$ layer is patterned to form a new transparent layer 14A. Since this new transparent layer 14A has the thickness of 1900 Å as described above, this new transparent layer 14A provides a 90° phase shift if the i-line is used.

In this embodiment, a connecting portion 18 is formed between the transparent layer 14 and the new transparent layer 14A by correcting the defective portion, that is, by removing the residual portion 16. Hence, this connecting portion 18 may be regarded as having a −90° phase error with respect to the light transmitting portion having the transparent layer 14. Accordingly, the transfer of the connecting portion 18 on the wafer at the time of the exposure can be neglected from the practical point of view due to the same operating principle as the embodiment described above with reference to FIGS. 15 through 24.

Figure 38:
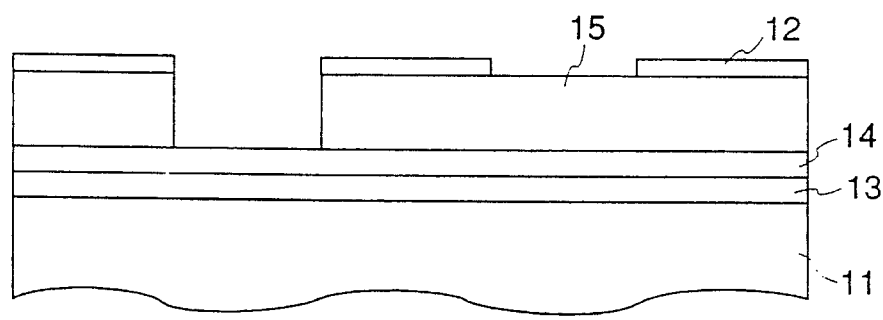
FIG. 38 is a cross sectional view showing an essential part of a second embodiment of the phase shift optical mask according to the present invention.

FIG. 38 is a cross sectional view showing an essential part of a second embodiment of the phase shift optical mask according to the present invention. In FIG. 38, those parts which are the same as those corresponding parts in FIG. 13 are designated by the same reference numerals, and a description thereof will be omitted.

As may be seen from FIG. 38, the etching stopper layer 13, the transparent layer 14 and the phase shifter 15 are stacked and interposed between the quartz substrate 11 and the light blocking pattern layer 12. Compared to the first embodiment shown in FIG. 13, this second embodiment differs in that the light blocking pattern layer 12 is provided on top.

According to this embodiment, the transparent layer 14 can be formed prior to the forming and patterning of the light blocking pattern layer 12. For this reason, when forming the transparent layer 14, a defective structure can be inspected and excluded. In other words, in the mask forming process, it is possible to always prepare a defect-free mask substrate which has the transparent layer 14 before starting the troublesome and time consuming patterning process.

Figure 39:
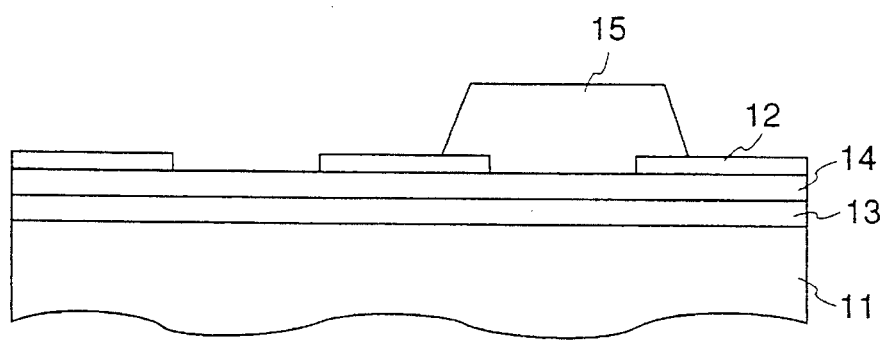
FIG. 39 is a cross sectional view showing an essential part of a third embodiment of the phase shift optical mask according to the present invention.

FIG. 39 is a cross sectional view showing an essential part of a third embodiment of the phase shift optical mask according to the present invention. In FIG. 39, those parts which are the same as those corresponding parts in FIG. 13 are designated by the same reference numerals, and a description thereof will be omitted.

As may be seen from FIG. 39, the etching stopper layer 13 and the transparent layer 14 are stacked and interposed between the quartz substrate 11 and the light blocking pattern layer 12, and the phase shifter 15 is provided on top as in the case of the first embodiment shown in FIG. 13.

According to this embodiment, it is also possible to always prepare a defect-free mask substrate which has the etching stopper layer 13 and the transparent layer 14 before starting the troublesome and time consuming patterning process.

As a modification of the above described embodiments, it is possible to interpose the etching stopper layer 13 between the transparent layer 14 and the phase shifter 15.

In addition, the transparent layer 14 may have a thickness to provide a phase shift of $90°+180°\cdot n$, where n is an integer.

Moreover, the present invention can also be applied to the so-called Cr-less phase shift optical mask which does not have a light blocking pattern.

Of course, the materials used for the various layers are not limited to those of the described embodiments. In addition, when forming the new phase shifter or the new transparent layer, it is not essential that the material used is the same as that of the original phase shifter or the original transparent layer.

Further, the present invention is not limited to these embodiments, but various variations and modifications may be made without departing from the scope of the present invention.

What is claimed is:

1. A phase shift optical mask adapted to receive exposure light, said phase shift optical mask comprising:

a transparent substrate;

a phase shifter which shifts a phase of the exposure light by 180° with respect to the phase of the exposure light transmitted through said transparent substrate; and a transparent layer interposed between said transparent substrate and said phase shifter, said transparent layer shifting the phase of the exposure light by $90°+180°\cdot n$, where n is an integer.

2. The phase shift optical mask as claimed in claim 1, which further comprises:

an etching stopper layer interposed between said transparent substrate and said transparent layer.

3. The phase shift optical mask as claimed in claim 1, which further comprises:

an etching stopper layer interposed between said phase shifter and said transparent layer.

4. The phase shift optical mask as claimed in claim 1, which further comprises:

a light blocking pattern layer provided on said phase shifter.

5. The phase shift optical mask as claimed in claim 1, which further comprises:

a light blocking pattern layer interposed between said phase shifter and said transparent layer.

6. The phase shift optical mask as claimed in claim 1, which further comprises:

an etching stopper layer interposed between said transparent substrate and said transparent layer;

an opening which exposes said etching stopper layer; and an isolated phase shifter portion provided within said opening so that a gap exposing said etching stopper layer is formed between said isolated phase shifter portion and said phase shifter, said isolated phase shifter portion shifting the phase of the exposure light by the same amount as the exposure light transmitted through said phase shifter and said transparent layer.

7. The phase shift optical mask as claimed in claim 1, which further comprises:

an etching stopper layer interposed between said transparent substrate and said transparent layer;

an opening which exposes said etching stopper layer; and an isolated transparent portion provided within said opening so that a gap exposing said etching stopper layer is formed between said isolated transparent portion and said transparent layer, said isolated transparent portion shifting the phase of the exposure light by the same amount as the exposure light transmitted through said transparent layer.

8. A method of correcting defects in a phase shift optical mask, the optical mask comprising a transparent substrate, a phase shifter which shifts a phase of the exposure light by 180° with respect to the phase of the exposure light transmitted through the transparent substrate and has a defective portion, and a transparent layer interposed between the transparent substrate and the phase shifter, the transparent layer shifting the phase of the exposure light by 90°+180°·n, where n is an integer, said method comprising the steps of:

(a) removing a portion of the phase shifter which includes the defective portion together with a portion of the transparent layer existing underneath the removed portion of the phase shifter, to form an opening in the phase shifter and the transparent layer; and (b) forming a new phase shifter portion within the opening from a material which shifts the phase of the exposure light by the same amount as the exposure light transmitted through the phase shifter and the transparent layer.

9. The method of correcting defects in a phase shift optical mask as claimed in claim 8, wherein the phase shift optical mask further comprises an etching stopper layer which is interposed between the transparent substrate and the transparent layer, said step (a) further comprises: removing the portion of the phase shifter and the portion of the transparent layer to form the opening so that the etching stopper layer is exposed by the opening.

10. The method of correcting defects in a phase shift optical mask as claimed in claim 9, wherein said step (b) further comprises: forming the new phase shifter portion so that a gap exposing the etching stopper layer is formed between the new phase shifter portion and the phase shifter.

11. The method of correcting defects in a phase shift optical mask as claimed in claim 8, wherein the defective portion of the phase shifter is a missing portion of the phase shifter.

12. A method of correcting defects in a phase shift optical mask, the optical mask comprising a transparent substrate, a phase shifter which shifts a phase of the exposure light by 180° with respect to the phase of the exposure light transmitted through the transparent substrate and has an unwanted residual portion, and a transparent layer interposed between the transparent substrate and the phase shifter, the transparent layer shifting the phase of the exposure light by 90°+180°·n, where n is an integer, said method comprising the steps of:

(a) removing the unwanted residual portion of the phase shifter together with a portion of the transparent layer existing underneath the removed unwanted residual portion, to form an opening in the transparent layer; and (b) forming a new transparent layer portion within the opening from a material which shifts the phase of the exposure light by the same amount as the transparent layer.

13. The method of correcting defects in a phase shift optical mask as claimed in claim 12, wherein the phase shift optical mask further comprises at etching stopper layer which is interposed between the transparent substrate and the transparent layer, said step (a) further comprising: removing the unwanted residual portion and the portion of the transparent layer to form the opening so that the etching stopper layer is exposed by the opening.

14. The method of correcting defects in a phase shift optical mask as claimed in claim 13, wherein said step (b) further comprises: forming the new transparent layer portion so that a gap exposing the etching stopper layer is formed between the new transparent layer portion and the transparent layer.

* * * * *

UNITED STATES PATENT AND TRADEMARK OFFICE
CERTIFICATE OF CORRECTION

PATENT NO. : 5,561,010
DATED : October 1, 1996
INVENTOR(S) : Hanyu et al

It is certified that error appears in the above-indentified patent and that said Letters Patent is hereby corrected as shown below:

Column 4
    Line 33, change "tile" to --the--.

Column 5
    Line 57, change "tile" to --the--.

Column 6
    Line 15, change "tile" to --the--.

Column 10
    Line 64, change "18" to --13--.

Signed and Sealed this

Twentieth Day of May, 1997

Attest:

BRUCE LEHMAN

Attesting Officer

Commissioner of Patents and Trademarks